United States Patent
Chan et al.

(10) Patent No.: US 6,201,486 B1
(45) Date of Patent: Mar. 13, 2001

(54) PRE-PROCESSING OF MULTIPLE SAMPLE RATES SOURCES TO SIMPLIFY AND IMPROVE MULTI-CHANNEL DAC DESIGN

(75) Inventors: Eric Chan; Yan Kang Yong, both of Singapore (SG)

(73) Assignee: Creative Technology Ltd., Creative Resource (SG)

( * ) Notice: Subject to any disclaimer, the term of this patent is extended or adjusted under 35 U.S.C. 154(b) by 0 days.

(21) Appl. No.: 09/452,607

(22) Filed: Dec. 1, 1999

(51) Int. Cl.$^7$ ...................................................... H03M 7/00
(52) U.S. Cl. ............................ 341/61; 341/144; 348/453
(58) Field of Search ..................... 341/144, 61; 323/236; 348/453, 642; 358/302; 355/38

(56) References Cited

U.S. PATENT DOCUMENTS

| | | | |
|---|---|---|---|
| 4,449,091 | * 5/1984 | Otoi | 323/236 |
| 5,016,106 | * 5/1991 | Yong-Je et al. | 358/183 |
| 5,715,252 | * 2/1998 | Sato | 358/302 |
| 5,963,153 | * 10/1999 | Rosefield et al. | 341/61 |
| 6,055,019 | * 4/2000 | Takahashi | 348/453 |
| 6,057,789 | * 5/2000 | Lin | 341/61 |

FOREIGN PATENT DOCUMENTS

| | | |
|---|---|---|
| 423921A2 | * 4/1991 | (EP) . |
| 2000149439A | * 5/2000 | (JP) . |

* cited by examiner

Primary Examiner—Howard L. Williams
Assistant Examiner—Jean Bruner Jeanglaude
(74) Attorney, Agent, or Firm—Woodcock Washburn Kurtz Mackiewicz & Norris LLP

(57) ABSTRACT

For a system having multiple sources of digital input data to be converted to analog by Digital to Analog Converters (DACs), pre-processing of the multiple sources of data is provided, such that differences in input sampling rates are accommodated. When multiple digital input sources are to be converted to analog signals in a single integrated circuit, these input signals are routed to a clock generator having Phase Locked Loop (PLL) circuitry and to respective Asynchronous Sample Rate Converters (ASRCs). Sample rate information relating to an input signal selected from among the multiple input signals is determined during a locking operation of the PLL. Based on the common clock output from the clock generator, the ASRCs convert the input signals to a single sampling rate. Once the multiple input sources are converted to a common sample rate by the ASRCs, the inputs are converted to analog signals by DACs using the common clock and are output by the single Integrated Circuit.

22 Claims, 5 Drawing Sheets

PRE-PROCESSING OF MULTIPLE SAMPLE RATES SOURCES TO SIMPLIFY AND IMPROVE MULTI-CHANNEL DAC DESIGN

FIELD OF THE INVENTION

The present invention relates generally to electronic circuit design. More particularly, the present invention relates to the conversion of digital signals sampled at different sampling rates to analog signals in a single integrated circuit.

BACKGROUND OF THE INVENTION

There has recently been tremendous growth in the area of digital electronics. The use of digital signals for transmitting and conveying data accurately for storage, reproduction or rendering has steadily increased with advances in digital technology. This growth has occurred in part because digital signals offer many advantages for certain types of design applications. However, since some systems additionally use analog counterparts to digital signals, some applications convert digital signals to analog signals, a continuous time-varying signal, for further processing, for playing of multi-media content, such as sound, or for other reasons. For the case of a single digital input signal, known to have been sampled at a fixed sample rate, conversion of the digital signal to an analog signal can be a relatively straightforward design task. Generally, the designer would implement a digital to analog converter (DAC), a design choice widely recognized by those skilled in the art of circuit design.

Often, however, a system designer, circuit designer or the like may wish for multiple digital input signals to be converted to analog signals. If all of the digital input signals were sampled at the same known sampling rate, the same DAC could be used to convert all of the signals to analog. However, oftentimes there are multiple inputs that have been sampled at different rates. Also, for multi-channel Digital to Analog Converters (DACs), input data to the DAC is currently handled differently depending on the type of DAC employed. For example, in the case of an I2S DAC, input data is applied to the DAC directly after extracting an N*Fs clock from the input signal. Fs is a generic reference understood to refer to sampling frequency by those of ordinary skill in the art. N is generally a positive integer greater than 1, and usually a power of 2, such as 2, 4, . . . 1024, etc. An N*Fs clock signal is thus a signal of higher frequency than the sampling rate of the input signal and is typically used to drive the digital logic of a DAC, other digital logic circuitry and/or the like. In the case of an AC97 DAC, the input is fixed and constrained to a predetermined input frequency, e.g., 48 KHz.

FIG. 1 illustrates a prior art integrated circuit having a multi-channel DAC design. In the case of multiple input sources, sampled at different sampling rates, being applied to a multi-channel I2S DAC chip 10', the I2S DAC chip 10' will have different N*Fs clocks, one for each input source. To clarify, both input i_1 (sampled at a frequency of Fs1) and an N1*Fs1 clock are input into DAC 200a. Both input i_2 (sampled at a frequency of Fs2) and an N2*Fs2 clock are input into DAC 200b, and so on. The parameter N is a parameter that is well known to those of ordinary skill in the art of circuit design, and its choice depends upon the circuitry for which it will be used. In this regard, different DACs can each have a different N associated therewith. Basing conversion on the N1*Fs1 clock input, DAC 200a converts digital input i_1 to analog output o_1. In a similar manner, basing conversion on the N2*Fs2 clock input, DAC 200b converts digital input i_2 to analog output o_2, and so on. In this fashion, n different analog outputs are produced from n different digital inputs using n different N*Fs clocks.

The implementation of n different N*Fs clocks, however, can cause difficulties, particularly when all of the circuitry is implemented on a single chip or integrated circuit 10'. The use of multiple N*Fs clocks, for example, can degrade the overall performance of the DAC. For instance, due to ground bounce, cross-talk, interference and/or the like, a disturbance in the electrical integrity of a ground plane, input signal, output signal, or power source may result. If this occurs, performance can decrease and the probability that spurious noise will superpose or otherwise interfere with the output increases.

Traditional efforts at solving these problems relating to multiple channel DAC design have involved attempts at eliminating the effects of multiple clocks during the layout phase of the chip or device. Designers have attempted to implement guard rings or extra isolation circuitry to eliminate or reduce the effects of the above problems. The provision of independent ground planes can also be of help, but further adds to the difficulties and costs of design. Further, these solutions can not ensure that the electrical integrity of the output signals will be maintained. Also, even an experienced layout artist may not appreciate the extra constraints being placed on the design process. Every new design contraint places a burden on the overall design process, and thus it is desirable to place as few contraints on a design as possible.

The above prior art chip design employed n different N*Fs clocks, which creates a whole set of associated problems, as noted above. An alternative proposed solution has been to use the same clock input, or no clock input in the case of a DAC with an internal clock, and to regulate the input to meet certain input requirements. Namely, the inputs have to meet the requirement that they were all sampled at the same rate. In the case of an AC97 DAC, the inputs are fixed and constrained to an input frequency of 48 KHz. As a result, however, there is a clear loss in the area of design flexibility. Inputs generally do not conform to a fixed sampling rate, especially when the inputs come from different sections of a system and are used for different purposes. Additional components may be added to cause the inputs to conform to the requirements of such a DAC. However, these extra components only add to the cost of a design. Also, these components would inherently be positioned off chip, since a DAC chip manufacturer can not anticipate the sampling rates of various inputs of a system not yet designed.

Consequently, it would be advantageous to provide a multi-channel DAC integrated circuit capable of converting digital inputs sampled at different sampling rates to analog signals, without regard to input sampling rates, that solves the above problems. It would be further advantageous to provide on chip pre-processing of the input signals that addresses the differences in sampling rates, so that one clock can be used for multiple DACs.

SUMMARY OF THE INVENTION

For a system having multiple sources of digital input data to be converted to analog by Digital to Analog Converters (DACs), the present invention provides pre-processing of the multiple sources of data, such that differences in input sampling rates are accommodated. When multiple digital input sources are to be converted to analog signals in a single integrated circuit, the present invention routes these input signals to a clock generator having Phase Locked Loop (PLL) circuitry and to respective Asynchronous Sample Rate Converters (ASRCs). Sample rate information relating to an input signal selected from among the multiple input signals is determined during a locking operation of the PLL. Based on the common clock output from the clock generator, the ASRCs convert the input signals to a single sampling rate. Once the multiple input sources are converted to a common sample rate by the ASRCs, the inputs are converted to analog signals by DACs using the common clock and are output by the single Integrated Circuit.

Other aspects of the present invention are described below.

BRIEF DESCRIPTION OF THE DRAWINGS

The digital circuitry and method for pre-processing multiple sample rates in accordance with the present invention are further described with reference to the accompanying drawings in which.

DETAILED DESCRIPTION OF PREFERRED EMBODIMENTS

As noted above, there have been described various solutions to the problem of multiple digital inputs having differing sample rates. As noted, drawbacks to a method utilizing multiple digital to analog converter (DAC) input clocks include cross-talk, ground bounce, and other signal interference difficulties. These drawbacks can significantly degrade the performance of a system, not only at the output of the DAC, but errors propagating through an overall system can be exaggerated with various degrees of severity e.g., when amplifiers and other signal processing components further process or magnify the resulting analog signal.

On the other hand, if the inputs are constrained to a fixed sampling rate, design flexibility and the ability to incorporate signals from systems using sampling standards that do not conform to the standard of the DAC are lost. To conform input signals to the sampling rate standard of a particular DAC requires additional off chip components, and can increase the expense of a design, make the design or system more cumbersome and/or create other compatibility issues.

The present invention provides digital to analog conversion circuitry having a phase lock loop circuit for comparing sample rates of multiple digital input signals, and selecting one of the digital input sample rates by a predetermined algorithm. The selected sample rate forms the basis for outputting a clock signal to be used for all of the input signals. However, first, the input signals are converted to a common sample rate based on the clock signal via asynchronous sample rate converters. Once the input signals conform to the common sample rate, the input signals and the clock signal are input to the DACs, for conversion to analog signals. In this fashion, one clock signal is used for all of the DACs.

The present invention addresses the shortcomings of the prior art in several ways. For example, since one clock is used for all of the DACs, the problems (discussed above) associated with cross-talk, ground bounce, and interference from numerous harmonics and multiples of harmonics are avoided. Additionally, because all of the circuitry is provided on a single chip, designing applications wherein multiple digital signals have different associated sample rates is facilitated greatly. Thus, performance is improved and spurious aberrations in electrical integrity are avoided.

It should be noted that the present invention may be implemented in a variety of applications, not limited to DAC applications. For example, anytime multiple digital signals are processed on a single chip in a manner that would require separate clocks of different frequencies, the above noted problems may be encountered. Thus, the present invention should be considered in view of the variety of digital applications in which it may be employed.

Figure 1:
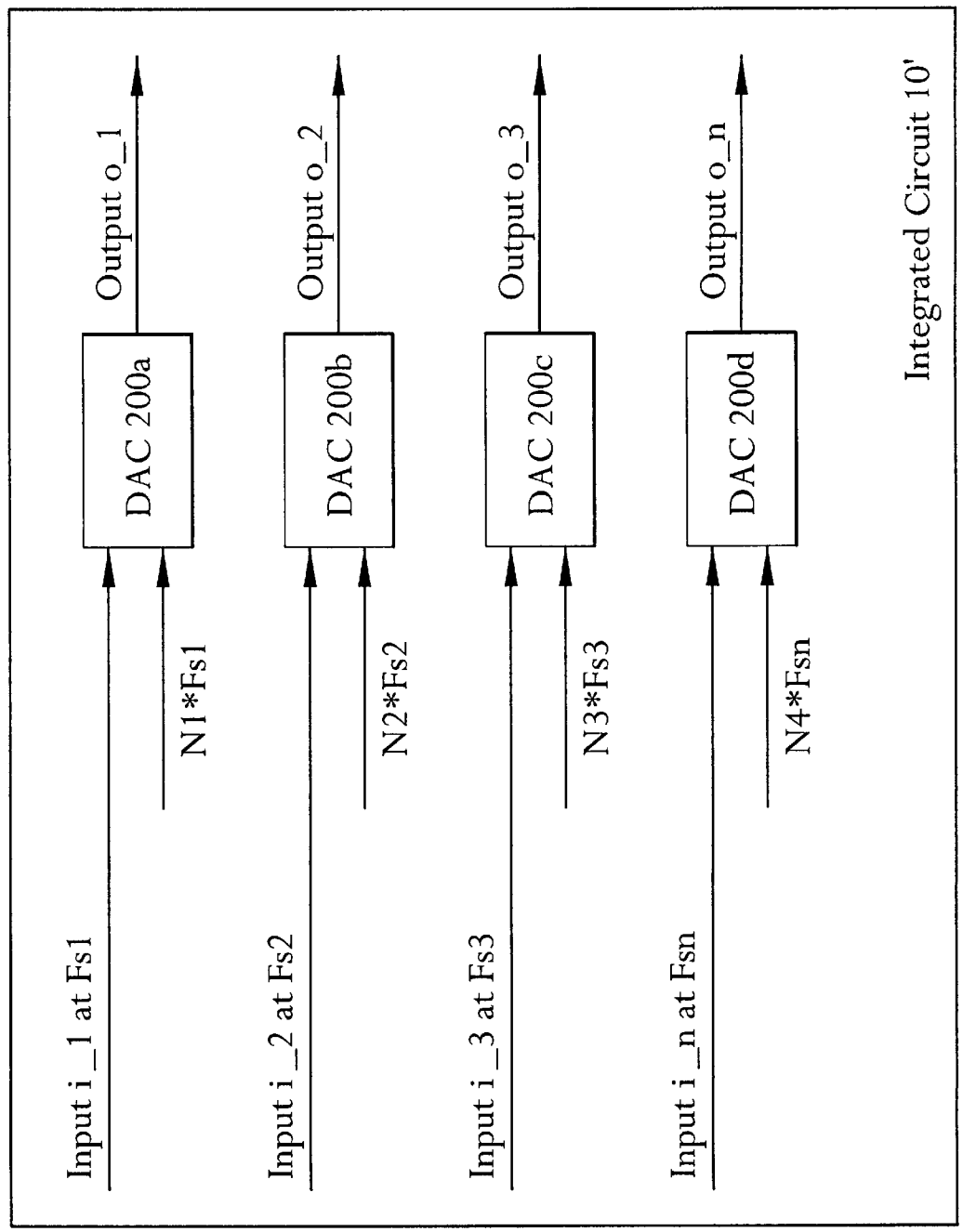
FIG. 1 is a block diagram of a prior art DAC integrated circuit design in which multiple clocks are employed as inputs to multiple DACs.
Figure 2:
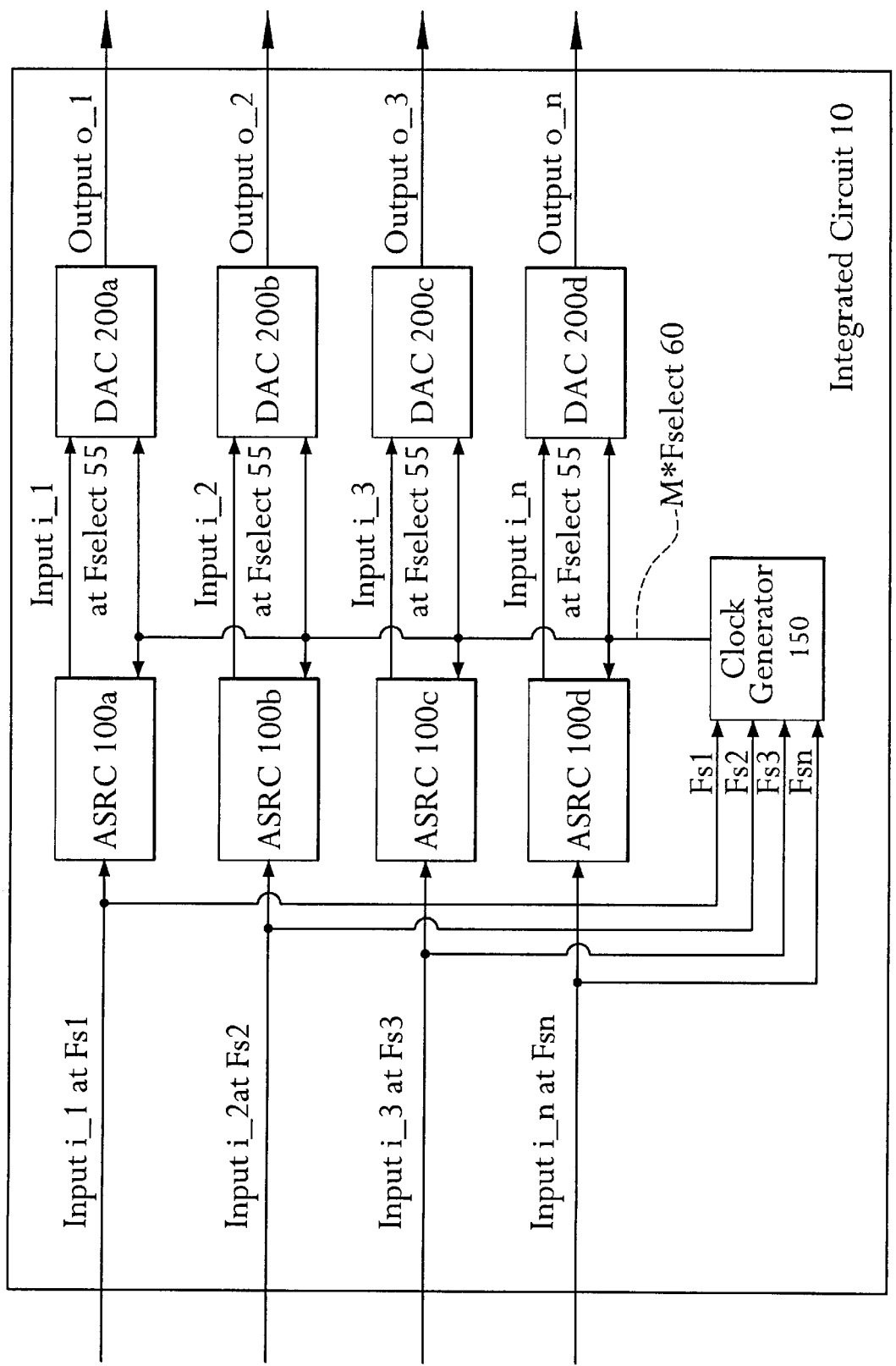
FIG. 2 is a block diagram of a DAC integrated circuit design in accordance with the present invention.

FIG. 2 is a block diagram of a DAC integrated circuit 10 design in accordance with the present invention. The digital inputs (input i_1 through input i_n) are each input to two different components. The digital inputs are all input to a clock generator circuit 150, and each digital input is input to respective asynchronous sample rate converters (ASRCs) 100a, 100b, 100c and 100d.

The clock generator 150 generates an M*Fselect clock signal 60 (typically a square wave having a frequency of M*Fselect) which is shared by ASRCs 100a, 100b, 100c and 100d and DACs 200a, 200b, 200c and 200d. The ASRCs 100a, 100b, 100c and 100d convert the inputs i_1 through i_n to a common sampling rate, namely Fselect 55 (the sampling rate M*Fselect divided by M). Then, each of DACs 200a, 200b, 200c and 200d can use the common clock signal M*Fselect 60 to convert each of the inputs i_1 through i_n, now pre-processed to have the same sampling rate Fselect 55, to analog output signals o_1 through o_n. Although four inputs are shown and described, an advantage of the present invention is that any number of inputs can be supported, and from any source e.g., I2S or S/PDIF.

Figure 3:
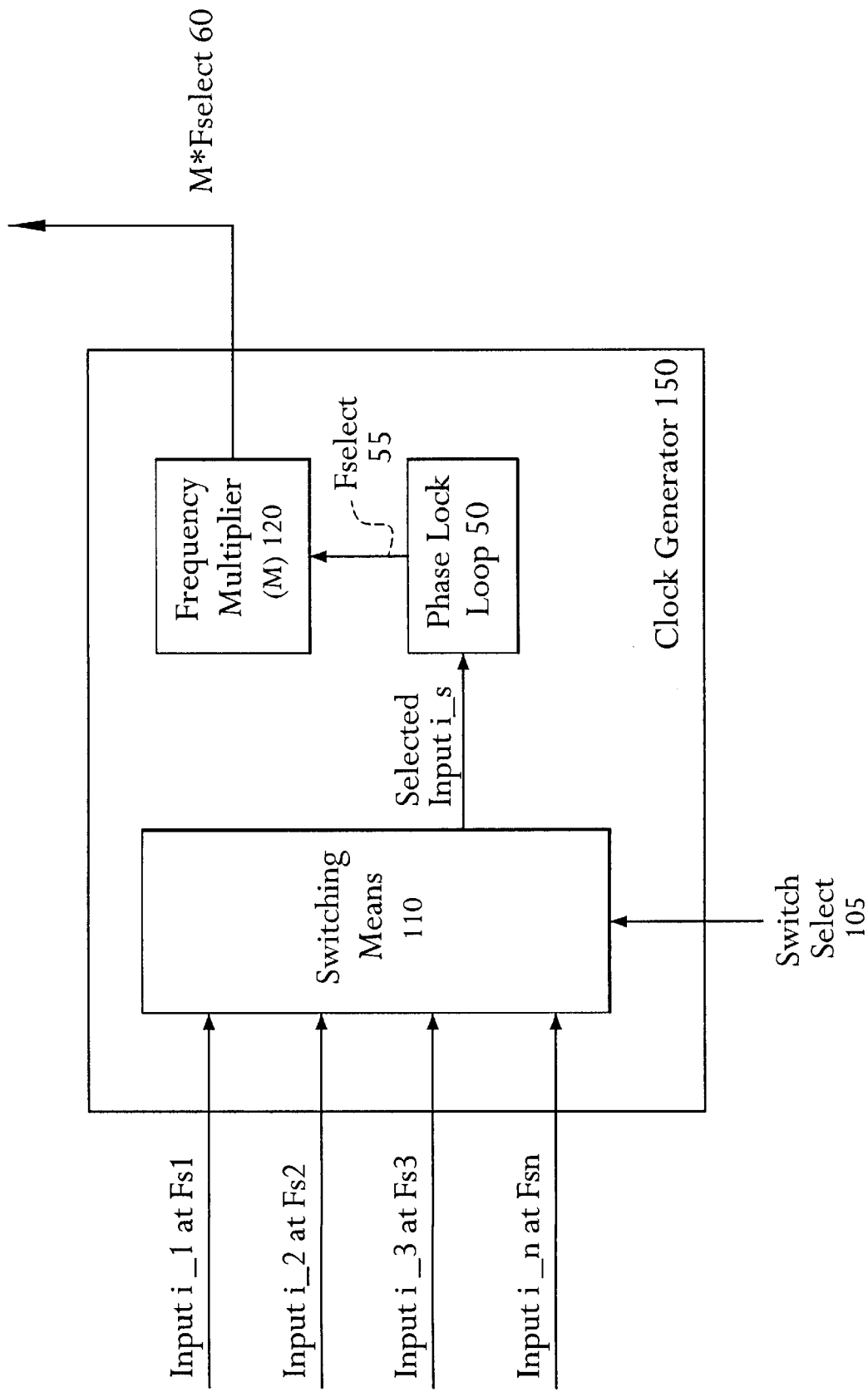
FIG. 3 is a block diagram of a clock generating portion including phase lock loop circuitry in accordance with the present invention.

FIG. 3 is a block diagram of clock generating circuitry 150 employing a phase lock loop circuit 50 where inputs i_1 through i_n, having associated sampling rates of Fs1 through Fsn, respectively, are input to a switching means 110. The switching means 110 has a switch select 105 for selecting one of the inputs for further processing. Switching means 110 can be, for example, a multiplexer. The setting of the switch select 105 can be effected with selection logic, accomplished by algorithms that compare the various input frequencies, achieved by a user selection, or realized according to any other techique commonly used when selecting one of multiple signals. In a presently preferred implementation, one of the inputs is selected through user intervention, whereby a user selects, via switch select 105 (either a mechanical hardware or software switch) of switching means 110, which input will be selected as a basis for frequency Fselect 55.

Figure 4:
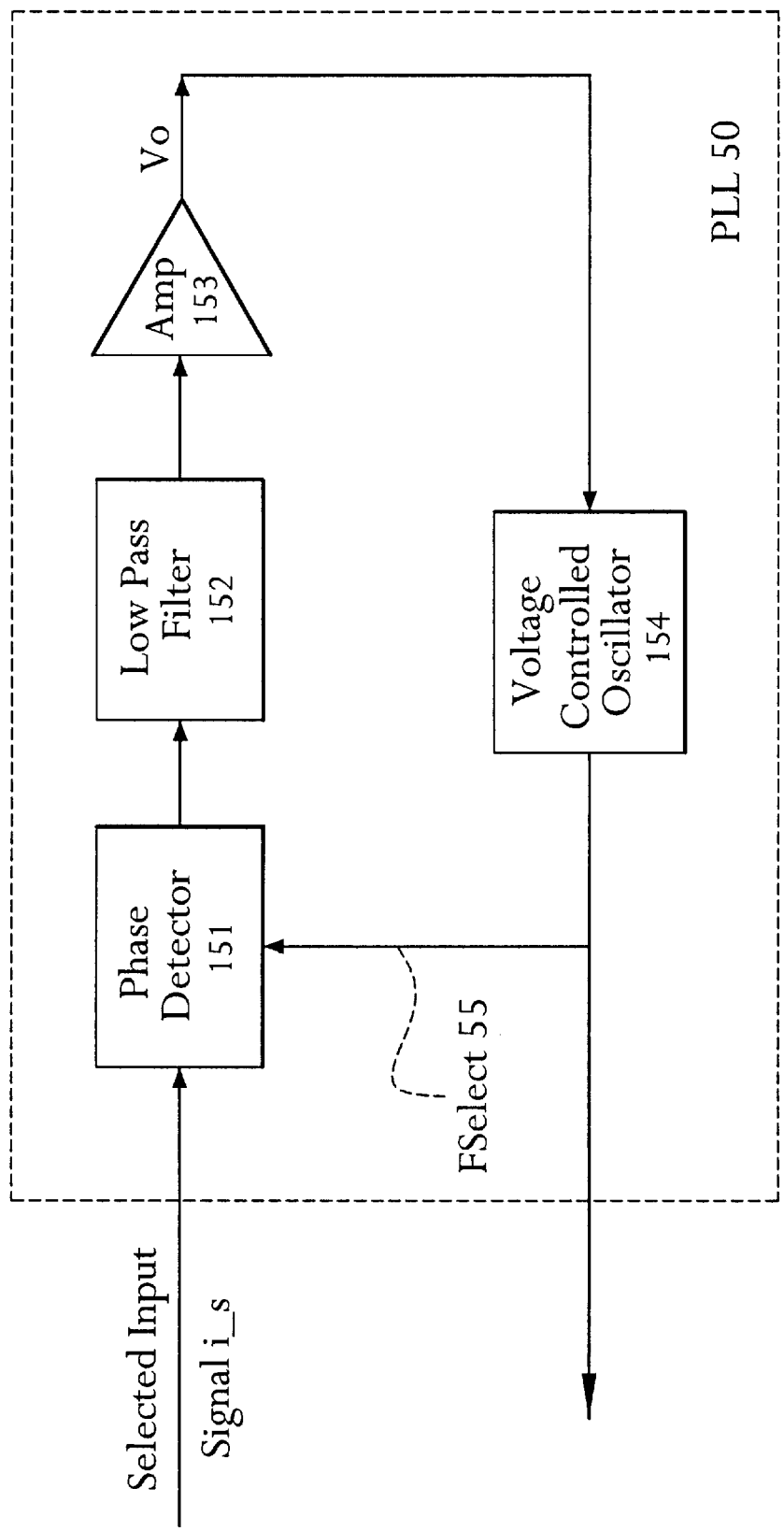
FIG. 4 is a block diagram of a traditional phase lock loop circuit for use in the present invention.

In a preferred embodiment, the selected input i_s, output from the switching means 110, is then input to a phase lock loop circuit 50. The phase lock loop circuit 50 operates through feedback to produce a signal with a frequency that matches the input signal. A traditional phase lock loop circuit 50 is depicted in FIG. 4. The input signal i_s is input to a phase detector portion 151 which compares the input signal i_s to the output of a voltage controlled oscillator (VCO) 154. The output of the phase detector 151 is sent through a low pass filter 152 and an amplifier 153, whereby an output voltage Vo is produced. When this voltage Vo is input to VCO 154, the VCO 154 outputs a time varying signal having a frequency that is a function of Vo. The output from VCO 154 is then fed back into the phase detector 151. As described, this feedback process continuously occurs until steady state at which point the frequency of the input signal i__s and Fselect 55 are the same. Referring back to FIG. 3, this signal output from the VCO 154 having a frequency of Fselect 55 is then input to a frequency multiplier circuit 120. This multiplier circuit 120 steps up the frequency of the signal by a factor of M from Fselect 55 to M*Fselect. The M*Fselect signal 60 can then be used as a clock common to all of the circuitry of the integrated circuit 10, so that multiple clocks are avoided.

Once the M*Fselect clock signal 60 is determined by the clock generator 150, the input signals (input i__1 through input i__n) can be normalized so that all of the input signals have a uniform or common sampling rate (or sampling frequency), Fselect 55. Referring back to FIG. 2, the asynchronous sample rate converters 100a–d perform this task by pre-processing the multiple sample rate sources (inputs i__1 through i__n) so that these inputs of differing sample rates are all converted to a final fixed sample rate. Then, the input data can be applied to the DACs 200a–d, which all use the same clock for conversion, namely the M*Fselect clock signal 60.

Figure 5:
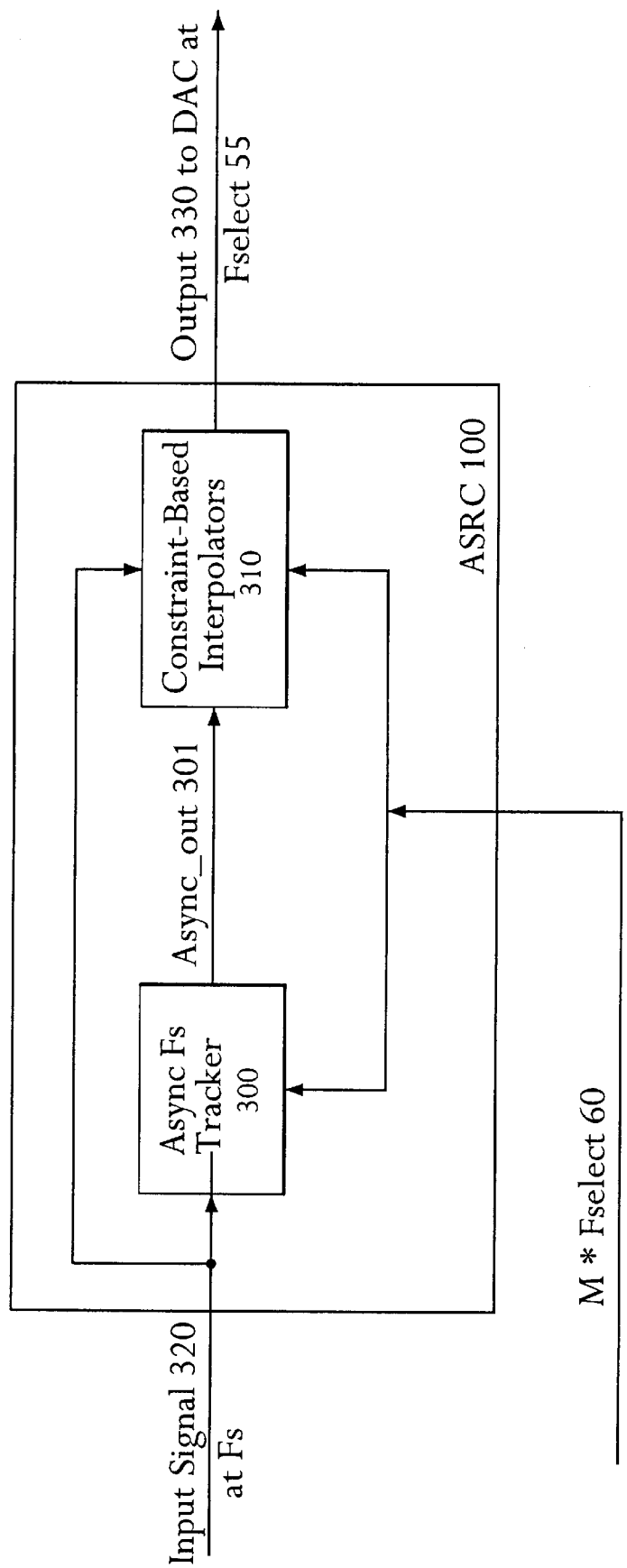
FIG. 5 is a block diagram of an asynchronous sample rate converter in accordance with the present invention.

FIG. 5 shows a block diagram of an asynchronous sample rate converter (ASRC) 100 which converts an input signal to a common sampling rate Fselect 55 based on the previously described generated clock signal M*Fselect 60. Once the clock signal M*Fselect 60 is generated, it is input to the ASRCs 100, and routed to both an asynchronous sample rate tracker (ASRT) 300 and contraint-based interpolators 310. This M*Fselect signal 60 drives the logic of the ASRT 300 and interpolators 310. To illustrate for one input signal, an input signal 320 having a sample rate Fs is input to the ASRT 300 and interpolators 310. The ASRT 300 gives an estimate of the difference in frequency between the sampling rate Fs of the input 320 and sampling rate Fselect 55, and outputs a signal Async__out 301 corresponding to this difference. This comparison can be made since the relationship between M*Fselect and Fselect is known i.e., every M cycles of M*Fselect is equivalent to one cycle of Fselect. This estimate of the difference in frequency is then used by the constraint-based interpolators 310 to interpolate the data points of input signal 320 so that it has an effective sampling rate of Fselect 55 at the output of the ASRC 100. The constraint-based interpolators 310 employ interpolation algorithms such as linear interpolation, sine function interpolation, Lagrange interpolation, and the like. It can be appreciated by one of ordinary skill in the art that these are widely implemented interpolation algorithms. When the same is performed for all of the input signals (input i__1 through input i__n), all of the signals are output from the ASRCs 100 to the DACs 200a–d with a common sampling rate Fselect 55.

As mentioned, in a presently preferred implementation of the present invention, the user selects which input will be the basis for the generation of the M*Fselect signal 60. This is an effective technique regardless of which input is selected. Referring back to FIG. 2, for instance, the user could choose the highest input sampling rate. If, for example, Fs1 is the highest sampling rate, then all the other inputs will be upsampled by the ASRCs 100b–d to this new sampling rate Fs1. However, if the input with the highest sampling rate is not chosen by the user, then some or all of the inputs will be downsampled. For example, if Fs2 is a lower rate than Fs1, but higher than Fs3 and Fsn, then input Fs1 with a sampling rate higher than Fs2 will be decimated by ASRC 100a down to Fs2 (downsampled) whereas Fs3 and Fsn will be interpolated by ASRCs 100c and 100d up to Fs2 (upsampled). Thus, the present invention works regardless of which input is selected as a basis for the generation of the common clock M*Fselect 60 for integrated circuit 10.

Although generally it does not matter which input is used as the basis for the clock signal since the ASRCs 100a–d operate to upsample and downsample where necessary, some knowledge about the inputs can still be useful. If the user can choose an input according to overall system parameters, interference with other system signals can be avoided. Also, the most effective clock can be implemented (due to rise and fall times, e.g., some frequencies are undesirable to use as a clock signal). Other design reasons may apply as well. In short, the ability to select the input, upon which the clock signal M*Fselect 60 will be based, is still valuable to the designer.

Once output from the ASRCs 100a–d, the signals (input i__1 through input i__n), having the same sampling rate Fselect 55, are input into the DACs 200a–d, respectively. The common clock signal M*Fselect 60 is also input into each of the DACs 200a–d. The resulting analog outputs (output o__1 through output o__n) from the DACS 200a–d are thus generated with a single clock DAC input. As one can readily appreciate, the addition of pre-processing of multiple sample rates sources in accordance with the present invention thus removes the need for different N*Fs clocks in an integrated circuit, and hence the problems associated with different N*Fs clocks are avoided.

Those skilled in the art will appreciate that numerous changes and modifications may be made to the preferred embodiments of the invention and that such changes and modifications may be made without departing from the spirit of the invention. For example, although the invention has been described with respect to digital to analog converters, the concept of normalizing multiple digital inputs to have the same effective sampling rate for further processing has broader applicability to other circuit needs as well. It is therefore intended that the appended claims cover all such equivalent variations as fall within the true spirit and scope of the invention.

What is claimed is:

1. Digital signal to analog signal conversion circuitry, comprising:

a clock generating element that selects one of a plurality of digital input signals and outputs a clock signal based on the sample rate of said selected digital input;

a plurality of asynchronous sample rate converters for changing the sample rate of said plurality of digital input signals such that the sample rate of the digital input signals output from the asynchronous sample rate converters is a fixed sample rate based on said clock signal; and a plurality of digital to analog converters for converting said digital input signals having the fixed sample rate to analog signals.

2. Digital signal to analog signal conversion circuitry as recited in claim 1, wherein said clock generating element includes a phase lock loop circuit.

3. Digital signal to analog signal conversion circuitry as recited in claim 1, wherein said clock generating element has a switching means for switching among said plurality of digital input signals.

4. Digital signal to analog signal conversion circuitry as recited in claim 3, wherein said switching means is a multiplexer.

5. Digital signal to analog signal conversion circuitry as recited in claim 1, wherein said selection of one of said plurality of digital input signals by said clock generating element is based on a predetermined algorithm.

6. Digital signal to analog signal conversion circuitry as recited in claim 5, wherein said predetermined algorithm for selecting a digital input signal selects the input with the highest sampling rate.

7. Digital signal to analog signal conversion circuitry as recited in claim 1, wherein said selection of one of said plurality of digital input signals by said clock generating element is performed by a user.

8. Digital signal to analog signal conversion circuitry as recited in claim 1, wherein said changing by said asynchronous sample rate converters is an upsampling of a digital input signal.

9. Digital signal to analog signal conversion circuitry as recited in claim 1, wherein said change by said asynchronous sample rate converters is a downsampling of a digital input signal.

10. Digital signal to analog signal conversion circuitry as recited in claim 1, wherein said clock signal is input to the plurality of digital to analog converters.

11. Digital signal to analog signal conversion circuitry as recited in claim 1, wherein said clock generating element, said plurality of asynchronous sample rate converters and said plurality of digital to analog converters are contained on a single integrated circuit.

12. Digital signal processing circuitry, comprising:
    a clock generating element that selects one of a plurality of digital input signals and outputs a clock signal based on the sample rate of said selected digital input; and
    a plurality of asynchronous sample rate converters for changing the sample rate of said plurality of digital input signals such that the sample rate of the digital input signals output from the asynchronous sample rate converters is a fixed sample rate based on said clock signal.

13. Digital signal processing circuitry as recited in claim 12, wherein said clock generating element includes a phase lock loop circuit.

14. Digital signal processing circuitry as recited in claim 12, wherein said changing by said asynchronous sample rate converters is an upsampling of a digital input signal.

15. Digital signal processing circuitry as recited in claim 12, wherein said change by said asynchronous sample rate converters is a downsampling of a digital input signal.

16. Digital signal processing circuitry as recited in claim 12, wherein said clock signal is input to the plurality of means for further processing said digital input signals output from said asynchronous sample rate converters.

17. Digital signal processing circuitry as recited in claim 16, wherein said clock generating element, said plurality of asynchronous sample rate converters and said means for further processing said digital input signals are contained on a single integrated circuit.

18. A method for converting digital signals to analog signals, comprising the acts of:
    selecting one of said digital signals;
    generating a clock signal having a frequency based on a sample rate of said selected digital signal;
    changing a sample rate of each of said digital signals to a fixed sample rate based on said generated clock signal; and
    converting said digital signals having the fixed sample rate to analog signals.

19. A method for converting digital signals to analog signals according to claim 18, wherein said selecting of one of said digital signals is performed with a switching means.

20. A method for converting digital signals to analog signals according to claim 18, wherein the digital signal with the highest sampling rate is selected.

21. A method for converting digital signals to analog signals according to claim 18, wherein a sample rate change is an upsampling of a digital signal to said fixed sample rate.

22. A method for converting digital signals to analog signals according to claim 18, wherein a sample rate change for is a downsampling of a digital signal to said fixed sample rate.

* * * * *